United States Patent
Kawasaki et al.

(10) Patent No.: US 7,642,018 B2
(45) Date of Patent: Jan. 5, 2010

(54) PHOTOSENSITIVE RESIN COMPOSITION, PATTERN FORMING METHOD AND ELECTRONIC PARTS USING THE PHOTOSENSITIVE RESIN COMPOSITION

(75) Inventors: Dai Kawasaki, Hitachi (JP); Nagatoshi Fujieda, Hitachi (JP); Nori Sasaki, Hitachi (JP); Noriyuki Yamazaki, Hitachi (JP)

(73) Assignee: Hitachi Chemical DuPont MicroSystems, Ltd., Tokyo (JP)

( * ) Notice: Subject to any disclaimer, the term of this patent is extended or adjusted under 35 U.S.C. 154(b) by 315 days.

(21) Appl. No.: 11/688,610

(22) Filed: Mar. 20, 2007

(65) Prior Publication Data

US 2007/0218400 A1    Sep. 20, 2007

(30) Foreign Application Priority Data

Mar. 20, 2006 (JP) .............................. 2006-077630
Feb. 22, 2007 (JP) .............................. 2007-042763

(51) Int. Cl.
*G03F 7/037* (2006.01)
*G03F 7/40* (2006.01)

(52) U.S. Cl. .................. 430/18; 430/270.1; 430/287.1; 430/325; 430/330

(58) Field of Classification Search .................. 430/18, 430/270.1, 287.1, 325, 330
See application file for complete search history.

(56) References Cited

U.S. PATENT DOCUMENTS

| 5,025,088 | A | * | 6/1991 | Maeda et al. ................ 528/353 |
| 5,399,460 | A | * | 3/1995 | Aldrich et al. ............ 430/287.1 |
| 5,866,627 | A | * | 2/1999 | Czornyj et al. ................ 522/18 |
| 6,048,663 | A | * | 4/2000 | Fujii et al. ................ 430/270.1 |
| 6,132,930 | A | * | 10/2000 | Hayashi et al. ........... 430/270.1 |

FOREIGN PATENT DOCUMENTS

JP    48-16620 A    3/1973

* cited by examiner

*Primary Examiner*—John S Chu

(57) ABSTRACT

A photosensitive resin composition includes (a) a polymer mainly composed of a repeating unit represented by the following general formula (I); (b) a dissolution accelerator for a developing solution; and (c) a solvent:

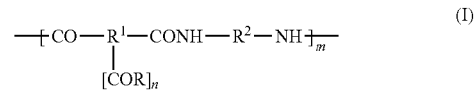

wherein $R^1$ is a trivalent or tetravalent organic group, $R^2$ is a bivalent organic group, R is a monovalent organic group having a carbon-carbon unsaturated double bond or a group represented by $O^-M^+$ ($M^+$ represents a hydrogen ion or a cation composed of hydrogen and a compound having the carbon-carbon unsaturated double bond) in which the compound having the carbon-carbon unsaturated double bond is ionically bonded, at least one carbon-carbon unsaturated double bond is contained in all repeating units, m is an integer of 2 or more, and n is 1 or 2.

7 Claims, 3 Drawing Sheets

PHOTOSENSITIVE RESIN COMPOSITION, PATTERN FORMING METHOD AND ELECTRONIC PARTS USING THE PHOTOSENSITIVE RESIN COMPOSITION

CROSS-REFERENCE TO RELATED APPLICATIONS

This application is based upon and claims the benefit of priority from the prior Japanese Patent Application No. 2006-077630, filed on Mar. 20, 2006; and Japanese Patent Application No. 2007-042763, filed on Feb. 22, 2007, the entire contents of both of which are incorporated herein by reference.

BACKGROUND OF THE INVENTION

1. Field of the Invention

The present invention relates to a photosensitive resin composition, a pattern forming method and electronic parts using the photosensitive resin composition. More particularly, the present invention relates to a photosensitive resin composition used for substrates for forming various mounting circuits and circuit substrates, and especially substrates for forming the circuit and circuit substrate as parts for forming an electric signal line directly on a suspension for a hard disc drive whose high capacity and downsizing are rapidly required, and a pattern forming method and electronic parts using the photosensitive resin composition.

2. Description of the Related Art

In terms of making high storage capacity and realizing speeding up in a hard disc drive, in place of a conventional MIG (metal in gap) or a magnetic induction type thin film as a magnetic head, a so-called MR (magneto resistive)-thin film hybrid type head obtained by integrating a magneto resistive type MR element with a thin film has been noticed.

Reading and writing of a magnetic signal are divided in one head in the MR head whereas the reading and writing are performed together in one head in the conventional head. Thus, a number of terminals are doubled (ground terminals are added as needed), and it becomes necessary to make a wire connecting the head to the disc main body a thin line.

However, when the line is made thin, the wire is easily corroded, impedances are hardly integrated, and mounting of the head becomes difficult. As a method for solving such a new problem, the method for forming the circuit directly on the suspension to which the head is mounted has been proposed by, for example Japanese Patent Application Laid-Open No. 48-16620-A.

A polyimide resin layer having and combining excellent resistance to heat, electric property and mechanical property is used for the above substrate for forming the circuit. However, when the polyimide resin layer has a high water absorption and such a substrate for forming the circuit is incorporated as the suspension in the hard disc drive main body, a dimension is largely altered as the water is absorbed in the polyimide resin layer, then the suspension itself is warped, and alignment accuracy is reduced as well as a distance between the disc and the main body is changed to cause performance fault as the device.

The polyimide resin having the low water absorption often contains fluorine, and is inflexible in structure. Thus, when such a polyimide resin is made photosensitive, its solubility in an organic solvent as a developing solution becomes remarkably low, and the development becomes difficult.

The present invention has been made in order to solve the conventional problems as the above, and an object of the present invention is to provide a photosensitive resin composition having a low water absorption and a good solubility in a developing solution and capable of forming a good pattern, as well as a pattern forming method and electronic parts using the photosensitive resin composition.

SUMMARY OF THE INVENTION

According to one aspect of the present invention, a photosensitive resin composition includes (a) a polymer mainly composed of a repeating unit represented by the following general formula (I); (b) a dissolution accelerator for a developing solution; and (c) a solvent:

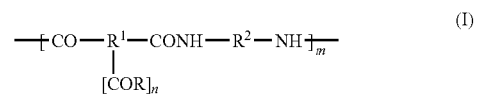

wherein $R^1$ is a trivalent or tetravalent organic group, $R^2$ is a bivalent organic group, R is a monovalent organic group having a carbon-carbon unsaturated double bond or a group represented by $O^-M^+$ ($M^+$ represents a hydrogen ion or a cation composed of hydrogen and a compound having the carbon-carbon unsaturated double bond) in which the compound having the carbon-carbon unsaturated double bond is ionically bonded, at least one carbon-carbon unsaturated double bond is contained in all repeating units, m is an integer of 2 or more, and n is 1 or 2.

According to another aspect of the present invention, a pattern forming method includes the steps of: forming a photosensitive resin film by applying the photosensitive resin composition according to claim 1 on a support substrate and drying; exposing the photosensitive resin film obtained from the applying and drying step; developing the photosensitive resin film after the exposure; and heating the photosensitive resin film after the development.

According to still another aspect of the present invention, electronic parts have a pattern layer obtained by the pattern forming method.

DETAILED DESCRIPTION OF THE PREFERRED EMBODIMENTS

Figure 1:
FIG. 1 is a schematic sectional view illustrating a step of forming a pattern of a photosensitive resin in an embodiment of the present invention.
Figure 2:
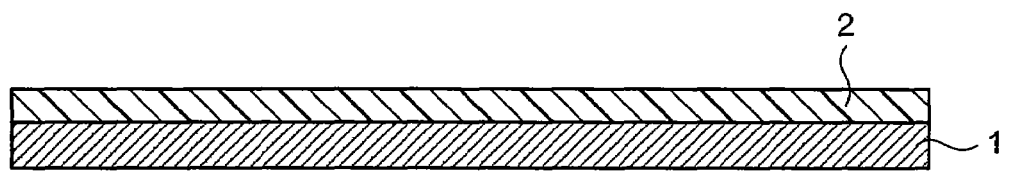
FIG. 2 is a schematic sectional view illustrating a step of forming the pattern of the photosensitive resin in the embodiment of the present invention.

Exemplary embodiments of the photosensitive resin composition, the pattern forming method and the electronic parts using the photosensitive resin composition according to the present invention will be explained in detail, with reference to the drawings. The present invention is not limited to these exemplary embodiments.

[Photosensitive Resin Composition]

The photosensitive resin composition according to the present invention contains (a) a polymer mainly composed of a repeating unit represented by the following formula (I), (b) a dissolution accelerator for a developing solution and (c) a solvent:

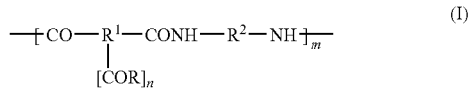

(I)

wherein, $R^1$ is a trivalent or tetravalent organic group, $R^2$ is a bivalent organic group, R is a monovalent organic group having a carbon-carbon unsaturated double bond or a group represented by $O^-M^+$ ($M^+$ represents a hydrogen ion or a cation composed of hydrogen and a compound having the carbon-carbon unsaturated double bond) in which the compound having the carbon-carbon unsaturated double bond is ionically bonded, at least one carbon-carbon unsaturated double bond is contained in all repeating units, m is an integer of 2 or more, and n is 1 or 2.

Each component in the photosensitive resin composition will be described below.

(a) Component (Polymer)

(a) In the polymer (hereinafter referred to as a component (a)) mainly composed of the repeating unit represented by the above general formula (I), $R^1$ in the general formula (I) is the trivalent or tetravalent organic group. This group is a residue other than a carboxyl group and an acid anhydride group in tetracarboxylic acid (dianhydride) or tricarboxylic acid (anhydride) used as a raw material, and is preferably a group having an aromatic ring such as benzene ring. Specifically, the residue of tetracarboxylic acid dianhydride described later is included.

$R^2$ in the general formula (I) is the bivalent organic group. This group is the residue other than an amino group in diamine used as the raw material, and specifically the residue of diamine described later is included.

In the general formula (I), m represents a repeating unit number, is the integer of 2 or more and preferably 30 to 150. Also, n is 1 or 2. In the general formula (I), R is the monovalent organic group having the carbon-carbon unsaturated double bond or a group represented by $O^-M^+$ in which the compound having the carbon-carbon unsaturated double bond is ionically bonded. Here, the group having carbon-carbon unsaturated double bond may include groups containing acryloyl, methacryloyl or allyl group, and the groups containing acryloyl or methacryloyl group are preferable in terms of reactivity.

Specific examples of R may include monovalent organic groups such as acryloxyalkyloxy group ($CH_2$=CH—COO—R'—O—, R' is for example, the bivalent organic group such as alkylene group having 1 to 10 carbon atoms), methacryloxyalkyloxy group ($CH_2$=C($CH_3$)—COO—R'—O—, R' is for example, the bivalent organic group such as alkylene group having 1 to 10 carbon atoms), acryloxyalkylamino group ($CH_2$=CH—COO—R'—NH—, R' is for example, the bivalent organic group such as alkylene group having 1 to 10 carbon atoms), and methacryloxyalkylamino group ($CH_2$=C($CH_3$)—COO—R'—NH—, R' is for example, the bivalent organic group such as alkylene group having 1 to 10 carbon atoms).

In the group represented by $O^-M^+$ in which the compound having the carbon-carbon unsaturated double bond is ionically bonded, $M^+$ represents the hydrogen ion or the cation composed of hydrogen and the compound having the group having the carbon-carbon unsaturated double bond, such as acryloyl group and methacryloyl group. The group represented by $O^-M^+$ in which the compound having the carbon-carbon unsaturated double bond is ionically bonded may include groups ($CH_2$=CH—COO—R'—$N^+H(C_nH_{2n+1})_2 \cdot O^-$, $CH_2$=C($CH_3$)—COO—R'—$N^+H(C_nH_{2n+1})_2 \cdot O^-$) obtained by the ionic bond with acrylate or methacrylate having amino group, such as dialkylaminoalkyl acrylate or dialkylaminoalkyl methacrylate (each alkyl group has 1 to 10 carbon atoms). Among them, those containing the group represented by $O^-M^+$ in which the compound having the carbon-carbon unsaturated double bond is ionically bonded are preferable in terms of reactivity, and in particular it is preferable to be the polymer mainly composed of the repeating unit represented by the following formula (II):

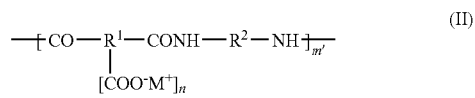

(II)

wherein $R^1$ represents a trivalent or tetravalent organic group, $R^2$ represents a bivalent organic group, $M^+$ represents a hydrogen ion or a cation composed of hydrogen and a compound having the carbon-carbon unsaturated double bond, at least one carbon-carbon unsaturated double bond is contained in all repeating units, m' is an integer of 30 to 150, and n is 1 or 2.

Here, m' in the general formula (II) is the repeating unit number of the backbone, and the range of m' is preferably 30 to 150. The polymer which is the component (a) may have the structural unit in addition to the repeating unit represented by the above general formula (II), but typically is composed of the repeating unit represented by the above general formula (II), and one having the hydrogen atom or a terminal group such as OH group at its both terminals is preferable. In the general formula (II), n is 1 or 2.

An amine compound is ionically bonded to polyamide acid to yield the polymer represented by the above general formula (II), for example by adding and stirring the amine compound having the acryloyl group or the methacryloyl group for imparting the photosensitivity to the polyamide acid obtained by polyaddition of tetracarboxylic acid dianhydride and a diamine compound.

In the component (a), a weight average molecular weight (Mw) of the polyamide acid is preferably 10,000 to 90,000. Mw can be measured by gel permeation chromatography and calculated in terms of standard polystyrene.

Tetracarboxylic acid dianhydride used for preparing the polymer mainly composed of the repeating unit represented by the above general formula (I) or (II) may include pyromellitic acid dianhydride, 3,3',4,4'-benzophenonetetracarboxylic acid dianhydride, 3,3',4,4'-biphenyltetracarboxylic acid dianhydride, 4,4'-oxydiphthalic acid dianhydride, 1,2,5,6-naphthalene tetracarboxylic acid dianhydride, 1,4,5,8-naphthalene tetracarboxylic acid dianhydride, 4,4'-sulfonyldiphthalic acid dianhydride and 2,2-bis(3,4-dicarboxyphenyl)propane dianhydride, but is not limited thereto as long as it is tetracarboxylic acid dianhydride.

The diamine compound used for preparing the polymer mainly composed of the repeating unit represented by the above general formula (I) or (II) may include aromatic diamine such as p-phenylenediamine, m-phenylenediamine, 2,2'-dimethyl-4,4'-diaminobiphenyl, p-xylylenediamine, m-xylylenediamine, 1,5-diaminonaphthalene, benzidine, 3,3'-dimethoxybenzidine, 4,4'-(or 3,4'-, 3,3'-, 2,4'-)diaminodiphenylmethane, 4,4'-(or 3,4'-, 3,3'-, 2,4'-)diaminodiphenyl ether, 4,4'-(or 3,4'-, 3,3'-, 2,4'-)diaminodiphenylsulfone, 4,4'-(or 3,4'-, 3,3'-, 2,4'-)diaminodiphenylsulfide, 4,4'-benzophenonediamine, 3,3'-benzophenonediamine, 4,4'-di(4-aminophenoxy)phenylsulfone, 4,4'-bis(4-aminophenoxy)biphenyl, 1,4-bis(4-aminophenoxy)benzene, 1,3-bis(4-aminophenoxy)benzene, 1,1,1,3,3,3-hexafluoro-2,2-bis(4-aminophenyl)propane, 2,2'-bis(trifluoromethyl)benzidine, 2,2-bis[4-(4-aminophenoxy)phenyl]propane, 3,3-dimethyl-4,4'-diaminodiphenylmethane, 3,3'-5,5'-tetramethyl-4,4'-diaminodiphenylmethane, 4,4'-di(3-aminophenoxy)phenylsulfone, 3,3'-diaminodiphenylsulfone, 2,2'-bis(4-aminophenyl)propane, 5,5'-methylene-bis-(anthranilic acid), 3,5-diaminobenzoic acid, 3,3'-dihydroxy-4,4'-diaminobiphenyl, 3,3'-dimethyl-4,4'-diaminobiphenyl, 2,2'-dimethyl-4,4'-diaminobiphenyl and 3,3'-dimethyl-4,4'-diaminobiphenyl-6,6'-disulfonic acid; heterocyclic diamine such as 2,6-diaminopyridine, 2,4-diaminopyridine, 2,4-diamino-s-triazine, 2,7-diaminobenzofuran, 2,7-diaminocarbazole, 3,7-diaminophenotiazine, 2,5-diamino-1,3,4-thiadiazole and 2,4-diamino-6-phenyl-s-triazine, trimethylenediamine, tetramethylenediamine, hexamethylenediamine, 2,2-dimethylpropylenediamine, aliphatic diamine such as diaminopolysiloxane represented by the following general formula (III):

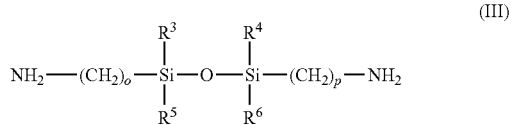

(III)

wherein $R^3$, $R^4$, $R^5$ and $R^6$ each independently represent alkyl groups having 1 to 6 carbon atoms, o and p are each independently integers of 1 to 10, but is not limited thereto as long as it is the diamine compound.

The above tetracarboxylic acid dianhydride and the diamine compound are each used alone or in combination of two or more.

Amine having the acryloyl group or the methacryloyl group, which is added for imparting the photosensitivity to the polyamide acid may include, but is not limited to, N,N-dialkylaminoalkyl (meth)acrylate such as N,N-diethylaminopropyl methacrylate, N,N-dimethylaminopropyl methacrylate, N,N-diethylaminopropyl acrylate and N,N-diethylaminoethyl methacrylate.

It is preferable to add 20 to 150 parts by weight of amine having the acryloyl group or the methacryloyl group relative to 100 parts by weight of the above polyamide acid, which is made the component (a).

(b) Dissolution Accelerator for Developing Solution

The dissolution accelerator (hereinafter referred to as the component (b)) which is the component (b) for the developing solution facilitates the solubility of the photosensitive resin film in the developing solution in a step of developing the photosensitive resin film after the exposure, described later. The dissolution accelerator according to the present invention does not affect adhesiveness of the photosensitive resin film to a lower layer thereof, e.g., an organic layer, a metal layer such as a copper layer or stainless layer. Thus, the dissolution accelerator is particularly effective for those having the polyimide resin layer as the organic layer and the suspension of the hard disc drive made from stainless.

The dissolution accelerator may include sulfonamide derivatives, and among them, benzenesulfonamide derivatives are preferable. Examples thereof may include benzenesulfonamide, toluenesulfonamide, methoxybenzenesulfonamide, benzenesulfonylanilide, toluenesulfonylanilide, methoxy-toluenesulfonylanilide, acetyl-toluenesulfonylanilide, toluenesulfonyl-N-methylamide, toluenesulfonyl-N-ethylamide, toluenesulfonyl-N-propylamide, toluenesulfonyl-N-butylamide, toluenesulfonyl-N-phenylamide, toluenesulfonyl-N-dimethylamide, toluenesulfonyl-N-diethylamide, and toluenesulfonyl-N-diphenylamide. Among them, N-phenylbenzenesulfonamide is preferable because it has the high effect.

The amount of the dissolution accelerator to be added is preferably 2 to 30 parts by weight and more preferably 3 to 15 parts by weight relative to 100 parts by weight of the above component (a).

When the amount of the dissolution accelerator to be added is less than 2 parts by weight, the photosensitive resin is not dissolved in the developing solution to make the pattern formation difficult. Meanwhile when it exceeds 30 parts by weight, the formed pattern becomes fragile, which is not preferable.

(c) Solvent

Solvents (hereinafter referred to as the component (c)) used upon synthesis of polyamide acid and as the component of the photosensitive resin composition in the present invention may include acetone, methyl ethyl ketone, toluene chloroform, methanol, ethanol, 1-propanol, 2-propanol, 1-butanol, 2-butanol, t-butanol, ethylene glycol monomethyl ether, propylene glycol monomethyl ether, xylene, tetrahydrofuran, dioxane, N,N-dimethylacetamide, N,N-dimethylformamide, N-methyl-2-pyrrolidone, γ-butyrolactone, dimethylsulfoxide, ethylene carbonate, propylene carbonate and sulfolane.

These organic solvents are used alone or in combination of two or more. It is preferable to add 100 to 500 parts by weight of the solvent which is the component (c) relative to 100 parts by weight of the above component (a).

The photosensitive resin composition according to the present invention is generally provided in a form of varnish. Sensitizers, light shielding agents, polymerization inhibitors, crosslinkers, photopolymerization initiators, stabilizers and adhesive aids may be added to the photosensitive resin composition if necessary.

According to the photosensitive resin composition, the pattern where the solubility in the developing solution is favorable and the water absorption or moisture absorption coefficient is low can be formed.

[Pattern Forming Method]

Subsequently the pattern forming method according to the present invention will be described. In the pattern forming method of the present invention, the photosensitive resin composition described above is applied onto a support substrate, e.g., a stainless substrate for forming the suspension, for example, by a spray method, a screen printing method or a rotation application method. Subsequently, the organic solvent in the photosensitive resin composition is removed by heating and drying to yield a photosensitive resin film which is a coating film with no adhesiveness. Active light having the pattern is irradiated onto this coating film to form, for example, the pattern of through holes. The active light to be irradiated may include ultraviolet ray, far-ultraviolet ray, visible light, electron beam and X ray. A desired relief pattern is obtained by removing a non-irradiated portion with the appropriate developing solution after irradiating the active light.

The developing solution is not particularly limited, and may include flame retardant solvents such as 1,1,1-trichloromethane, alkali aqueous solutions such as sodium carbonate aqueous solution and tetramethylammonium hydroxide aqueous solution, good solvents such as N,N-dimethylformamide, dimethylsulfoxide, N,N-dimethylacetamide, N-methyl-2-pyrrolidone and γ-butylolactone, and mixed solvents of these good solvents with poor solvents such as lower alcohol, water and aromatic hydrocarbon. After the development, rinse with the poor solvent is performed as needed.

A polyimide pattern can be obtained by heating the relief pattern obtained in this way, for example at 80 to 400° C. for 5 to 300 minutes to close an imide ring.

In the pattern forming method according to the present invention, the solubility of the photosensitive resin film in the developing solution after the exposure is favorable. Thus, the time period for the pattern formation can be shortened and the workability is enhanced. In addition, the sensitivity of the formed pattern is high, and thus, the exposure amount can be reduced and the production cost can be reduced.

Subsequently, steps of forming the pattern on the suspension of the hard disc drive as one example by the pattern forming method according to the present invention will be described based on drawings.

Figure 3:
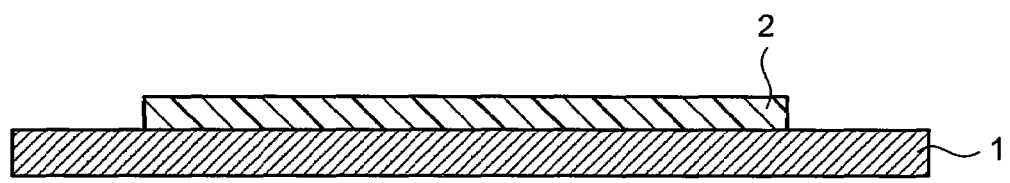
FIG. 3 is a schematic sectional view illustrating a step of forming the pattern of the photosensitive resin in the embodiment of the present invention.

FIGS. 1 to 9 are schematic sectional views illustrating the steps of forming the pattern of the photosensitive resin. In these FIGS. 1 to 9, first, the support substrate 1, e.g., stainless foil which composes the suspension is prepared (FIG. 1). Subsequently, the photosensitive resin composition described above is applied onto this support substrate 1 using a spin coater (not shown in the figure) (FIG. 2), and an insulation layer 2 is formed by performing the exposure and development (FIG. 3).

Figure 4:
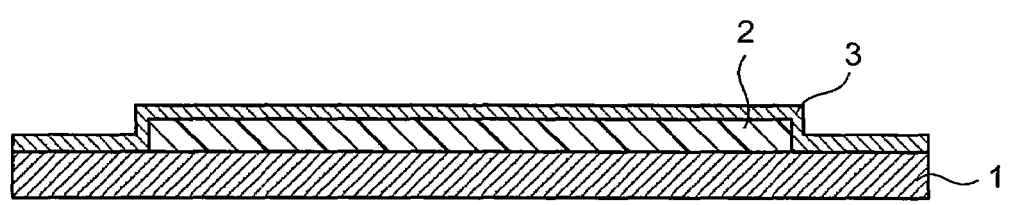
FIG. 4 is a schematic sectional view illustrating a step of forming the pattern of the photosensitive resin in the embodiment of the present invention.
Figure 5:
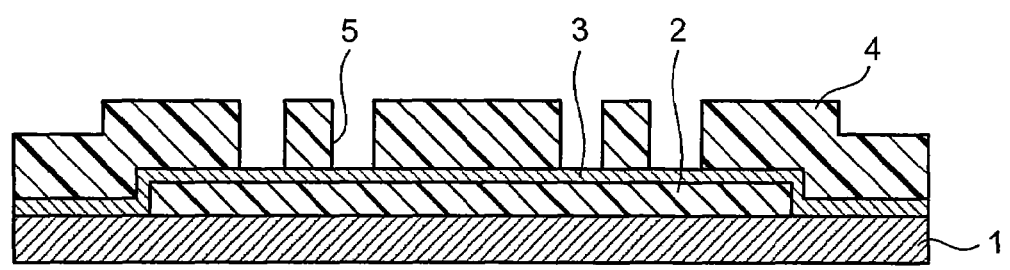
FIG. 5 is a schematic sectional view illustrating a step of forming the pattern of the photosensitive resin in the embodiment of the present invention.
Figure 6:
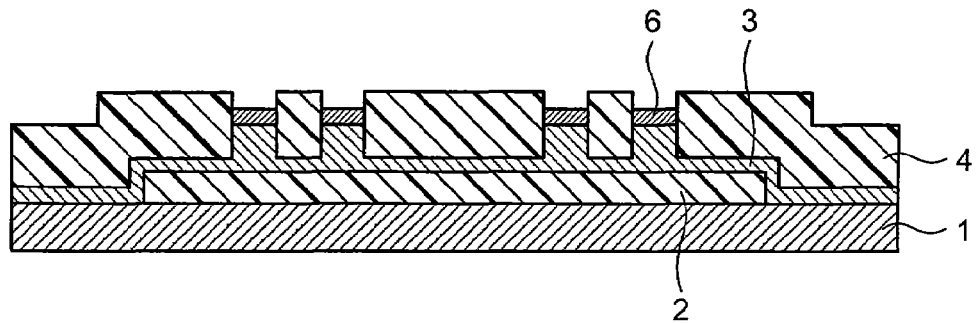
FIG. 6 is a schematic sectional view illustrating a step of forming the pattern of the photosensitive resin in the embodiment of the present invention.

Subsequently, in order to grow a plating film on the insulation layer 2 which is an insulator, a seed layer 3 as the metal layer which is a priming is formed (FIG. 4). The seed layer 3 can be formed by sputtering a bilayer of a chromium thin film and a copper thin film at high frequency. Subsequently, a resist 4 is applied onto the seed layer 3 and the exposure with a predetermined pattern and the development are given thereto (FIG. 5), and then a circuit conductor having a multilayer structure of copper, nickel and gold and the like is laminated at an opening 5 of the resist pattern by a sequential electrolytic plating method to form a circuit layer 6 (FIG. 6).

Figure 7:
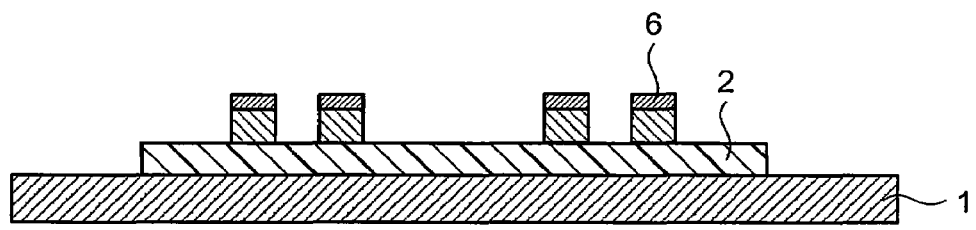
FIG. 7 is a schematic sectional view illustrating a step of forming the pattern of the photosensitive resin in the embodiment of the present invention.
Figure 8:
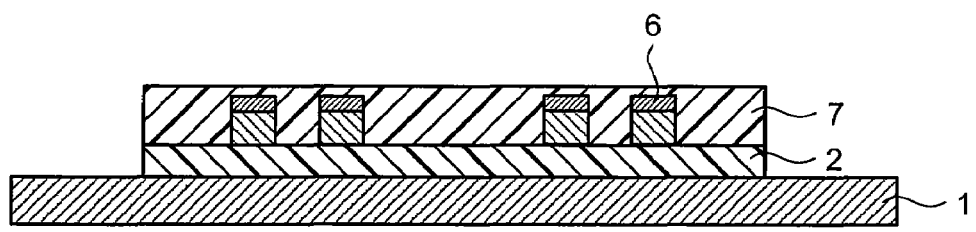
FIG. 8 is a schematic sectional view illustrating a step of forming the pattern of the photosensitive resin in the embodiment of the present invention.
Figure 9:
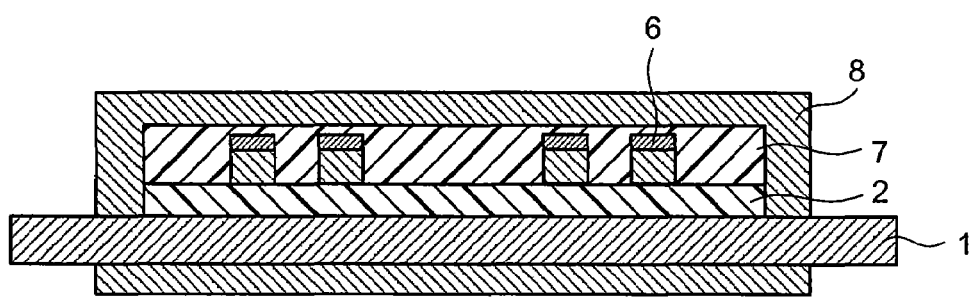
FIG. 9 is a schematic sectional view illustrating a step of forming the pattern of the photosensitive resin in the embodiment of the present invention.

After forming the circuit layer 6, the resist 4 is peeled and the seed layer 3 is removed by etching (FIG. 7). Subsequently, in order to protect the circuit layer 6, a protection layer 7 is formed by applying the same photosensitive resin composition as in the above onto the circuit layer 6 and giving the exposure and the development thereto (FIG. 8). Thereafter, a cover 8 which covers the given portions of the protection layer 7 and the support substrate 1 can be provided to form gimbals (FIG. 9).

[Electronic Parts]

The photosensitive resin composition according to the present invention is used for forming the pattern according to the pattern forming method described above, and the obtained pattern is applied to the electronic parts as the interlayer insulation layer, the priming insulation layer or the surface protection film layer of the substrates for forming mounting circuits and the circuit substrates. Here, the electronic parts include semiconductor devices, multilayer wiring boards and various electronic devices, and in particular, the suspension of the hard disk drive is suitable. That is, the photosensitive resin composition according to the present invention is preferably used as the parts for forming electric signal lines directly on the suspension of the hard disc drive for the substrate for forming the circuit and the circuit substrates.

The electronic parts according to the present invention have the pattern having a good shape and property as a surface protection film layer or an interlayer insulation film layer of the circuit. Thus, the highly reliable electronic parts can be obtained. These effects are particularly remarkable when the applied electronic parts is the suspension of the hard disc drive.

Figure 10:
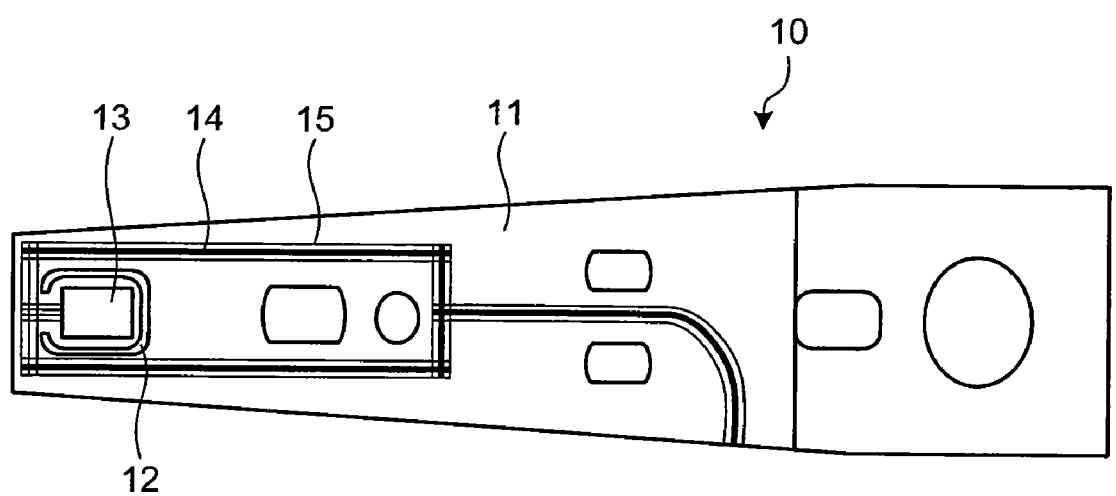
FIG. 10 is a schematic plain view showing a suspension of a hard disc drive using the photosensitive resin in an embodiment of the present invention.

FIG. 10 is a schematic plain view showing the suspension of the hard disc drive, on which the pattern has been formed using the photosensitive resin composition according to the present invention. In FIG. 10, the suspension 10 mounts a magnetic head providing the writing and reading functions of data in a magnetic disc. The suspension 10 is a member which controls a space between the magnetic disc and the magnetic head to several ten nm with good accuracy, and is composed of a platy member 11 produced from stainless. The gimbals 13 is integrally formed by cutting 12 at a tip of the platy member 11 composing the suspension 10, and a slider (not shown in the figure) having the magnetic head is secured on the gimbals 13.

The insulation layer (not shown in the figure) made from the photosensitive resin composition has been formed on the platy member 11, the given pattern circuit composed of a copper conductor layer 14 has been mounted thereon, and the protection layer 15 made from the photosensitive resin composition has been formed further thereon. The given pattern circuit has been mounted on the platy member 11. Thus, this suspension is referred to as a so-called "suspension with the circuit".

EXAMPLES

The present invention will be described more specifically with reference to the following Examples and Comparative Examples, but the present invention is not limited to the Examples.

(Preparation of Photosensitive Resin Solution)

The photosensitive resin used in Examples 1 to 3 and Comparative Example was obtained by the following method. Polyamide acid having a weight average molecular weight of 42,000 was obtained by adding and dissolving 15 parts by weight of p-phenylenediamine and 10 parts by weight of 2,2'-bis(trifluoromethyl)benzidine in 300 parts by weight of N-methyl-2-pyrrolidone, and subsequently adding 50 parts by weight of 3,3',4,4'-biphenyltetracarboxylic acid dianhydride to polymerize. Then, 50 parts by weight of N,N-dimethylaminopropyl methacrylate, 2 parts by weight of bis(cyclopentadienyl)bis(2,6-difluoro-3(1H-pyl-yl)phenyl)titanium and 0.5 parts by weight of diethylamino-3-tenoyl-coumarin were added to this polyamide acid solution and stirred to yield a photosensitive resin solution. It is clear that the component (a) (in which N,N-dimethylaminopropyl methacrylate which is the compound having the carbon-carbon unsaturated double bond has been ionically bonded to —COOH in the side chain of the polyamide acid, which satisfies the general formulas (I) and (II)) of the present invention has been formed by combining the polyamide acid with N,N-dimethylaminopropyl methacrylate at the above combination ratio.

Example 1

A photosensitive resin composition obtained by adding 10 parts by weight of N-phenylbenzenesulfonamide to the obtained photosensitive resin solution and stirring was rotation-applied onto a stainless substrate, and dried on a hotplate at 90° C. for 3 minutes to obtain a photosensitive resin film having a film thickness of 12 µm. This photosensitive resin film was exposed with a high pressure mercury lamp through a photo mask. This exposure was performed by irradiating energy at 100 J/m². Subsequently, immediately after the above substrate was heated on the hotplate at 110° C. for one minute, the substrate was immersed in a developing solution which was N-methyl-2-pyrrolidone. The photosensitive resin film in an unexposed portion was dissolved in 110 seconds.

At 140 seconds after the immersion, the substrate was removed from the developing solution and rinsed with isopropyl alcohol. This substrate was placed in an oven at 350° C. for one hour to obtain a relief pattern having a film thickness of about 5 µm. A water absorption coefficient of the obtained film was 0.8%. This water absorption coefficient was obtained by peeling the film attached on the substrate, immersing it in water and measuring its weight by heating and drying after water was sufficiently absorbed, and calculating a change rate of the film weight before immersing in water and the film weight after heating and drying.

Example 2

Evaluation was performed in the same way as in Example 1, except that the amount of N-phenylbenzenesulfonamide to be added was changed to 5 parts by weight. As a result, the unexposed portion was dissolved in 250 seconds, and the water absorption coefficient of the obtained film was 0.8%.

Example 3

The evaluation was performed in the same way as in Example 1, except that the amount of N-phenylbenzenesulfonamide to be added was changed to 15 parts by weight. As a result, the unexposed portion was dissolved in 30 seconds, and the water absorption coefficient of the obtained film was 0.9%.

Comparative Example

The evaluation was performed in the same way as in Example, except that no N-phenylbenzenesulfonamide was added to the obtained photosensitive resin solution. As a result, the unexposed portion was not completely dissolved even at 150 second after starting to immerse in the developing solution. After immersing in the developing solution for total 180 seconds, the substrate was rinsed, but no clear relief pattern was obtained because the developing solution infiltrated in the space between the exposed portion and the substrate.

It has been found that the photosensitive resin films in Examples 1 to 3 can be exposed with the extremely low exposure energy and have the extremely high exposure sensitivity. Although the unexposed portion was not completely dissolved in the developing solution in Comparative Example, the unexposed portion was completely dissolved in the developing solution in a very short time in Examples 1 to 3 and the high dissolution acceleration effect in the developing solution was observed. The water absorption coefficient in the films obtained in Examples 1 to 3 was very low.

As in the above, the photosensitive resin composition and the pattern forming method using the photosensitive resin composition according to the present invention can form the pattern having the high solubility in the developing solution and the extremely low water absorption coefficient upon exposure and development of the photosensitive resin film. Therefore, the present invention is useful for the electronic parts which require the low water absorption coefficient, and particularly suitable for the suspension of the hard disc drive.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photosensitive resin composition comprising:
    (a) a polymer mainly composed of a repeating unit represented by the following general formula (I);
    (b) a dissolution accelerator for a developing solution, wherein the dissolution accelerator is a benzenesulfonamide derivative; and
    (c) a solvent:

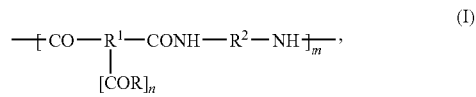

wherein $R^1$ is a trivalent or tetravalent organic group, $R^2$ is a bivalent organic group, R is a monovalent organic group having a carbon-carbon unsaturated double bond or a group represented by $O^-M^+$ in which the compound having the carbon-carbon unsaturated double bond is ionically bonded, at least one carbon-carbon unsaturated double bond is contained in all repeating units, m is an integer of 2 or more, and n is 1 or 2, and wherein $M^+$ represents a hydrogen ion or a cation composed of hydrogen and a compound having the carbon-carbon unsaturated double bond.

2. The photosensitive resin composition according to claim 1, wherein the (a) polymer is a polymer mainly composed of a repeating unit represented by the following general formula (II):

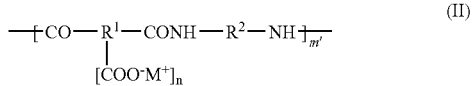

wherein $R^1$ represents a trivalent or tetravalent organic group, $R^2$ represents a bivalent organic group, $M^+$ represents a hydrogen ion or a cation composed of hydrogen and a compound having the carbon-carbon unsaturated double bond, at least one carbon-carbon unsaturated double bond is contained in all repeating units, m' is an integer of 30 to 150, and n is 1 or 2.

3. The photosensitive resin composition according to claim 1, wherein the benzenesulfonamide derivative is N-phenylbenzenesulfonamide.

4. The photosensitive resin composition according to claim 1, wherein 2 to 30 parts by weight of the (b) dissolution accelerator is contained relative to 100 parts by weight of the (a) polymer.

5. A pattern forming method comprising the steps of:
  forming a photosensitive resin film by applying the photosensitive resin composition according to claim 1 on a support substrate and drying;
  exposing the photosensitive resin film obtained from the applying and drying step;
  developing the photosensitive resin film after the exposure; and
  heating the photosensitive resin film after the development.

6. An electronic part comprising a pattern layer obtained by the pattern forming method according to claim 5.

7. The electronic part according to claim 6, wherein the electronic part is a suspension of a hard disc drive.

* * * * *